United States Patent
Adduci et al.

(10) Patent No.: US 6,958,660 B2
(45) Date of Patent: Oct. 25, 2005

(54) METHOD AND APPARATUS FOR CONTROLLING OSCILLATION FREQUENCY

(75) Inventors: Francesco Adduci, Milan (IT); Antonio Colaci, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 64 days.

(21) Appl. No.: 10/754,486

(22) Filed: Jan. 9, 2004

(65) Prior Publication Data

US 2004/0196109 A1 Oct. 7, 2004

(30) Foreign Application Priority Data

Jan. 10, 2003 (IT) .................................. MI2003A000029

(51) Int. Cl.[7] ................................................. H03C 1/62
(52) U.S. Cl. ............. 331/158; 331/116 R; 331/116 FE; 331/34; 331/177 R; 331/44
(58) Field of Search .............................. 331/158, 116 R, 331/116 FE, 185, 44, 34, 177 R

(56) References Cited

U.S. PATENT DOCUMENTS 6,870,434 B2 * 3/2005 Han et al. .................... 331/158

* cited by examiner

Primary Examiner—Arnold Kinkead
(74) Attorney, Agent, or Firm—Lisa K. Jorgenson; E. Russell Tarleton; Seed IP Law Group PLLC

(57) ABSTRACT

A method for the determination of a bias current of a quartz oscillator that includes the phases of: defining a series of bias currents of prefixed values; supplying to said quartz oscillator a bias current value not yet used; verifying the presence of an oscillation signal at the output of said quartz oscillator; supplying in the negative case to said quartz oscillator a bias current value not yet used and repeating the preceding phase; verifying the presence of the correct oscillation frequency; supplying in the negative case a bias current not yet used to said quartz oscillator and repeating the phase of verifying the presence of an oscillation signal at the output of said quartz oscillator; storing, in the positive case, that the supplied current is valid; repeating the preceding phases up to the exhaustion of said series of values of bias currents; fixing as a bias current of said quartz oscillator the algebraic average of the currents regarded as valid.

18 Claims, 4 Drawing Sheets

METHOD AND APPARATUS FOR CONTROLLING OSCILLATION FREQUENCY

BACKGROUND OF THE INVENTION

1. Field of the Invention

The present invention refers to a method for the generation and control of an oscillation frequency and particularly to a method for the determination of a bias current of a quartz oscillator.

2. Description of the Related Art

In the digital electronic applications it is often necessary to use an oscillator to generate an oscillating signal as synchronism reference that is stable in frequency and that has a low jitter.

Because of the necessary high precision and the requirements of frequency stability, a high frequency oscillator (for instance higher than 50 MHz) cannot use a phase locked oscillator (PLL), but rather a quartz oscillator is necessary to make the signal resonate at a harmonic frequency, for instance at the third one.

To get the required frequency stability, the oscillator bias current must be stable and compensated in temperature.

The typical value of the transconduttances (and therefore of the bias current) that are part of the transfer function calculation are determined in the design phase. It can happen that the distribution of some electric parameters (that are dependent on the building process of the integrated circuits) can cause variations in the current from one integrated circuit to another. Accordingly, not all manufactured oscillators can have the required features.

BRIEF SUMMARY OF THE INVENTION

The disclosed embodiment of the present invention and its variations are directed to a design of an oscillator that, independent of the manufacturing process has the required stability features.

In accordance with one embodiment of the present invention, a method for the determination of the bias current of a quartz oscillator is provided that includes the phases of: defining a series of bias currents of prefixed values; supplying to said quartz oscillator a bias current value not yet used; verifying the presence of an oscillation frequency at the output of said quartz oscillator; supplying in the negative case a bias current value not yet used to said quartz oscillator and repeating the preceding phase of verifying the presence of the correct oscillation frequency; supplying in the negative case a bias current not yet used to said quartz oscillator and repeating the phase of verifying the presence of an oscillation at the output of said quartz oscillator; storing in the positive case that the supplied current is valid; repeating the preceding phases up to the exhaustion of said value series of bias currents; fixing as the bias current of said quartz oscillator the algebraic average of the currents regarded as valid.

In accordance with another embodiment of the invention, a method for determining the bias current of a quartz oscillator is provided that includes defining a plurality of bias current values; supplying in sequence the plurality of bias current values to the quartz oscillator; determining the oscillation frequency of an output signal at the output of the quartz oscillator corresponding to each bias current value; determining the bias current values that generate a valid oscillation frequency in the output signal of the quartz oscillator; and fixing as a bias current of the quartz oscillator an algebraic average of the bias currents determined to generate a valid oscillation frequency.

In accordance with the foregoing embodiment, the method further includes defining the plurality of bias current values to be in two sections, a first section having current values separated from each other by a first preset value and a second section having current values separated from each other by a second preset value, the second preset value being lower than the first preset value.

In accordance with another aspect of the foregoing embodiment, the method of determining the bias current of the quartz oscillator is performed at one from among the following times: the turning on of the quartz oscillator, occasionally after the turning on of the quartz oscillator, or periodically after turning on of the quartz oscillator.

In accordance with another aspect of the foregoing embodiment, the algebraic average of the currents is added to a preset current to determine the bias current of the quartz oscillator.

In accordance with another embodiment of the invention, an apparatus for the determination of the bias current of a quartz oscillator is provided, the apparatus including a ramp signal generator having an input coupled to the output of the quartz oscillator and an output on which is generated a ramp signal; a voltage comparator comparing the ramp signal to a reference voltage and generating a comparison output signal; a control logic circuit having an input for receiving the comparison output signal from the comparator, the control logic circuit configured to generate a bias current control signal at an output thereof responsive to the comparison output signal of the comparator; and a current generator having an input for receiving the bias current control signal from the control logic circuit and for generating a bias current signal to the quartz oscillator; wherein the control logic circuit is further configured to determine the bias current of the quartz oscillator by: generating a plurality of bias currents having a prefixed value; supplying the plurality of bias current values sequentially to the quartz oscillator; verifying the oscillation frequency of the output signal of the quartz oscillator for each of the plurality of bias current values; storing the bias current values determined to have valid oscillation frequencies in the output signal of the quartz oscillator; and determining as a bias current of the quartz oscillator the algebraic average of the bias currents determined to have valid oscillation frequencies in the output signal of the quartz oscillator.

BRIEF DESCRIPTION OF THE DRAWINGS

The features and the advantages of the present invention will be made more evident by the following detailed description of a particular embodiment, illustrated as a non-limiting example in the annexed drawings, wherein.

DETAILED DESCRIPTION OF THE INVENTION

Figure 1:
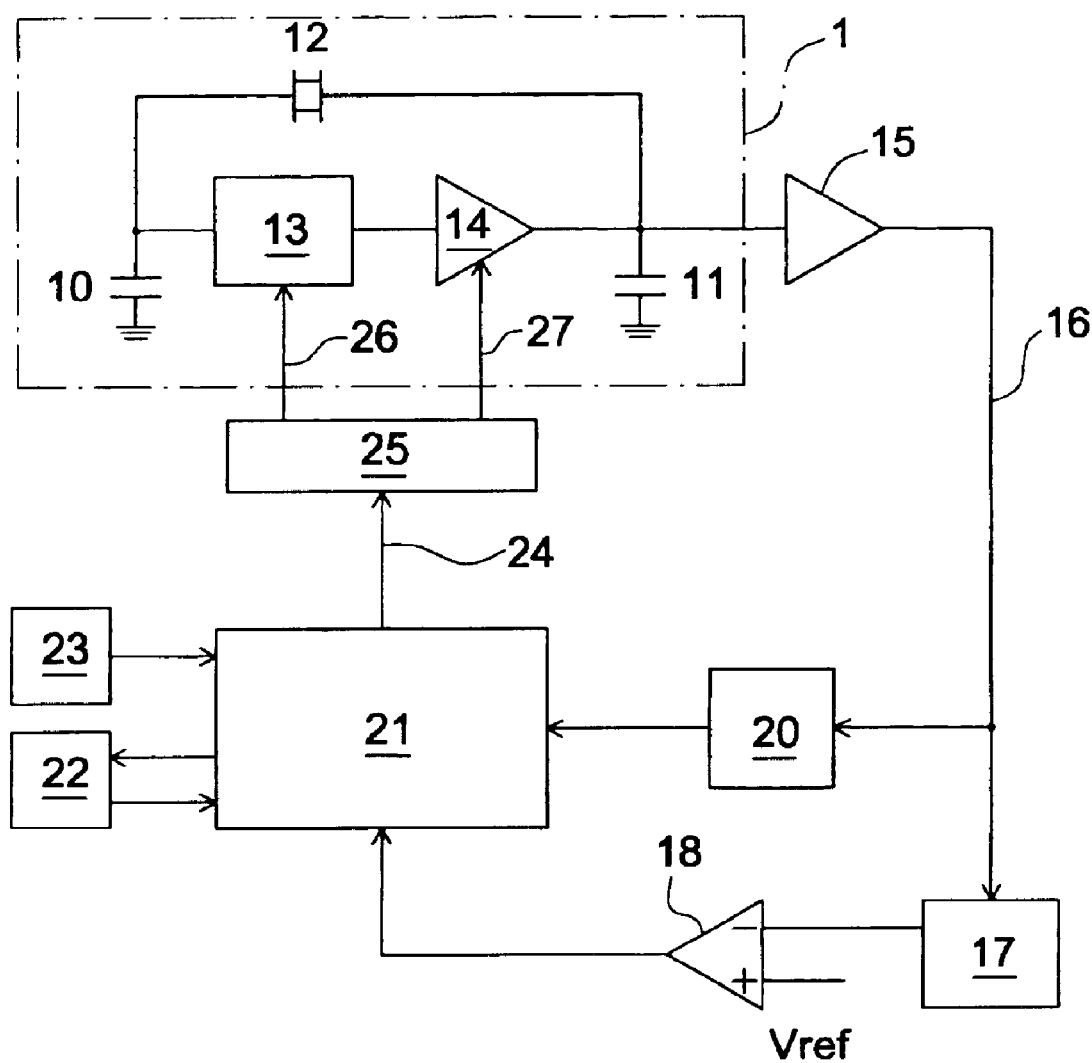
FIG. 1 shows a block scheme of a quartz oscillator according to the present invention.

In FIG. 1 an oscillator 1 that includes an amplifier 14 is shown, the amplifier having a transconduttance gm, preceded by a band pass filter 13, by a quartz 12 with a terminal connected to the output of the amplifier 14 and a terminal connected to the input of the filter 13, and by two capacitors 10 and 11, each capacitor having a terminal connected respectively to the two terminals of the quartz 12 and the other terminal to ground.

The output signal from the oscillator 1, available at the output of the amplifier 14, is supplied to a clipper amplifier 15, which supplies a digital signal called master clock to its output 16.

The output consisting of a digital clock signal 16 is supplied to a ramp generator 17. The output of the ramp generator 17 is connected to an input of a comparator 18, and to the other input of the comparator 18 a reference voltage Vref is connected. The output of the comparator 18 is connected to a control logic 21. The ramp generator 17 provides a signal at its output (with a ramp shape) proportional to the frequency available at its input. This voltage is compared with the reference voltage Vref in a prefixed point of the ramp-shaped signal. The output of the comparator 18 is a digital value, showing if the voltage applied to the comparator 18 is smaller or greater than the reference voltage Vref. In other words, the ramp generator 17 and the comparator 18 provide a digital signal to the control logic 21 showing if the oscillation frequency of the oscillator 1 is the correct one. If the signal at the comparator 18 overcomes the reference voltage Vref, it means that the oscillator 1 is working on a harmonic frequency lower than the desired one (that is with a wider clock period). Therefore, not overcoming the reference voltage Vref indicates the reaching of the correct working frequency.

The digital clock signal 16 is also supplied to an oscillation detector 20, whose output is connected to the control logic 21. The oscillation detector 20 can be constituted by a flip flop that changes state when it receives the oscillation at its clock input, that is the digital clock signal 16.

The block having the numerical reference 23 represents a circuit for the activation of the control logic 21, which can happen both at the firing of the circuit 23 and periodically (or occasionally) during the working of the oscillator 1.

The block having the numerical reference 22 represents an oscillator circuit that provides the synchronism signal of the control logic 21. It is deactivable on request of the control logic 21.

The control logic 21 provides a signal 24 to a current generator 25 that biases both the amplifier 14 and the filter 13 by means of the signals 27 and 26, respectively. The signal 24 represents the correct value for biasing the circuits of the oscillator 1. Accordingly, the current generator 25, by receiving the above value, will supply the respective working currents to the amplifier 14 and to the filter 13.

The control logic 21 can also contain circuits for the thermal compensation of the currents.

Figure 2A:
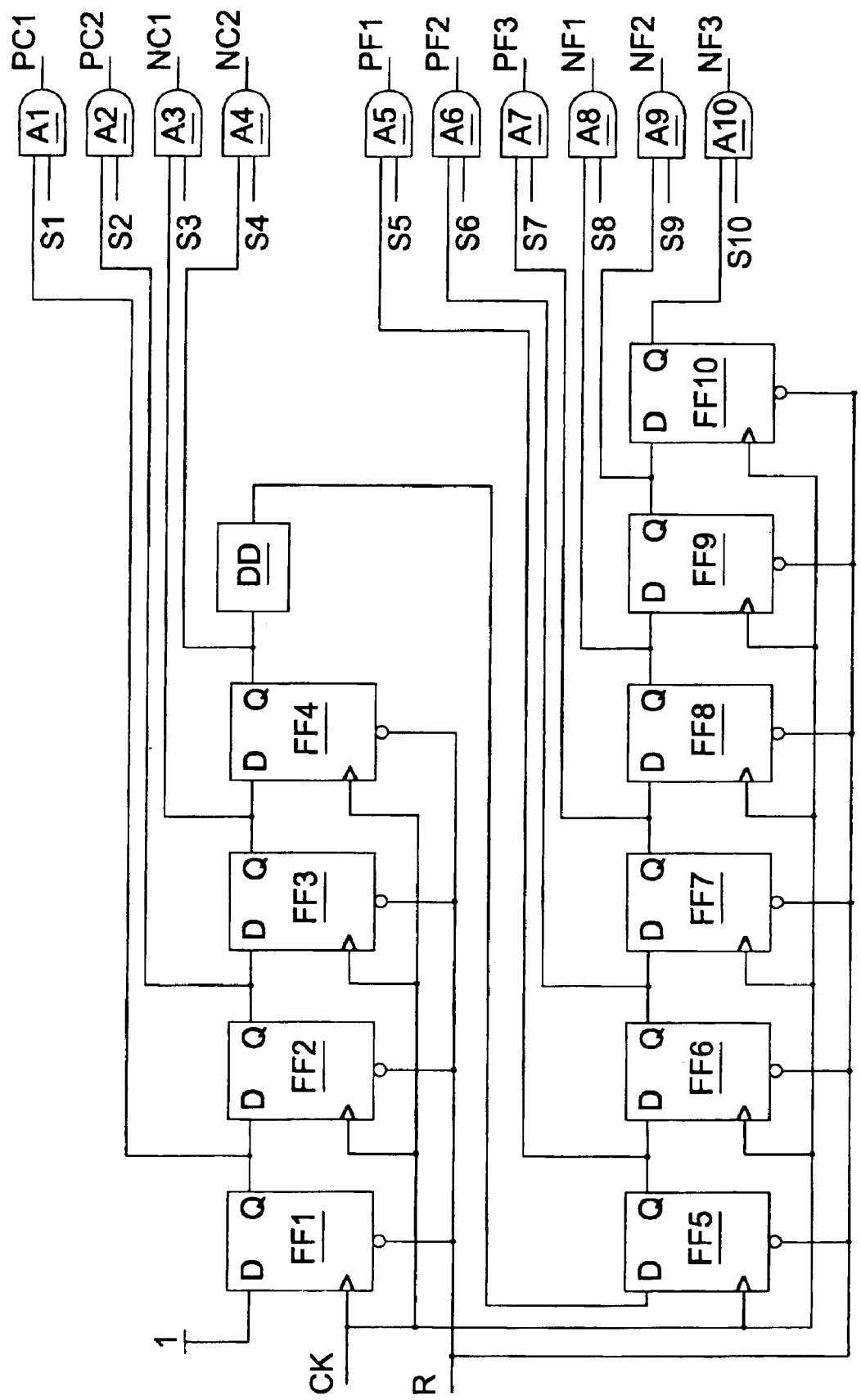
FIG. 2a is a partial schematic of the control logic of FIG. 1.

FIG. 2a is a schematic of a portion of the control logic 21. Ten flip flops of the D type with the reference FF1–FF10 are shown connected in cascade with each other, with a delay element DD placed between the flip flop FF4 and the flip flop FF5. The flip flops FF1–FF10 have a common synchronism signal provided by the signal CK, and they have reset signals in common, which are provided by the signal R. The signal CK is generated by the oscillator circuit 22. The signal R is output from the activation circuit 23.

The outputs of the flip flops FF1–FF10 are individually applied to a respective input of the AND gates A1–A10, and at the other input the signals S1–S10 are respectively applied.

Figure 3:
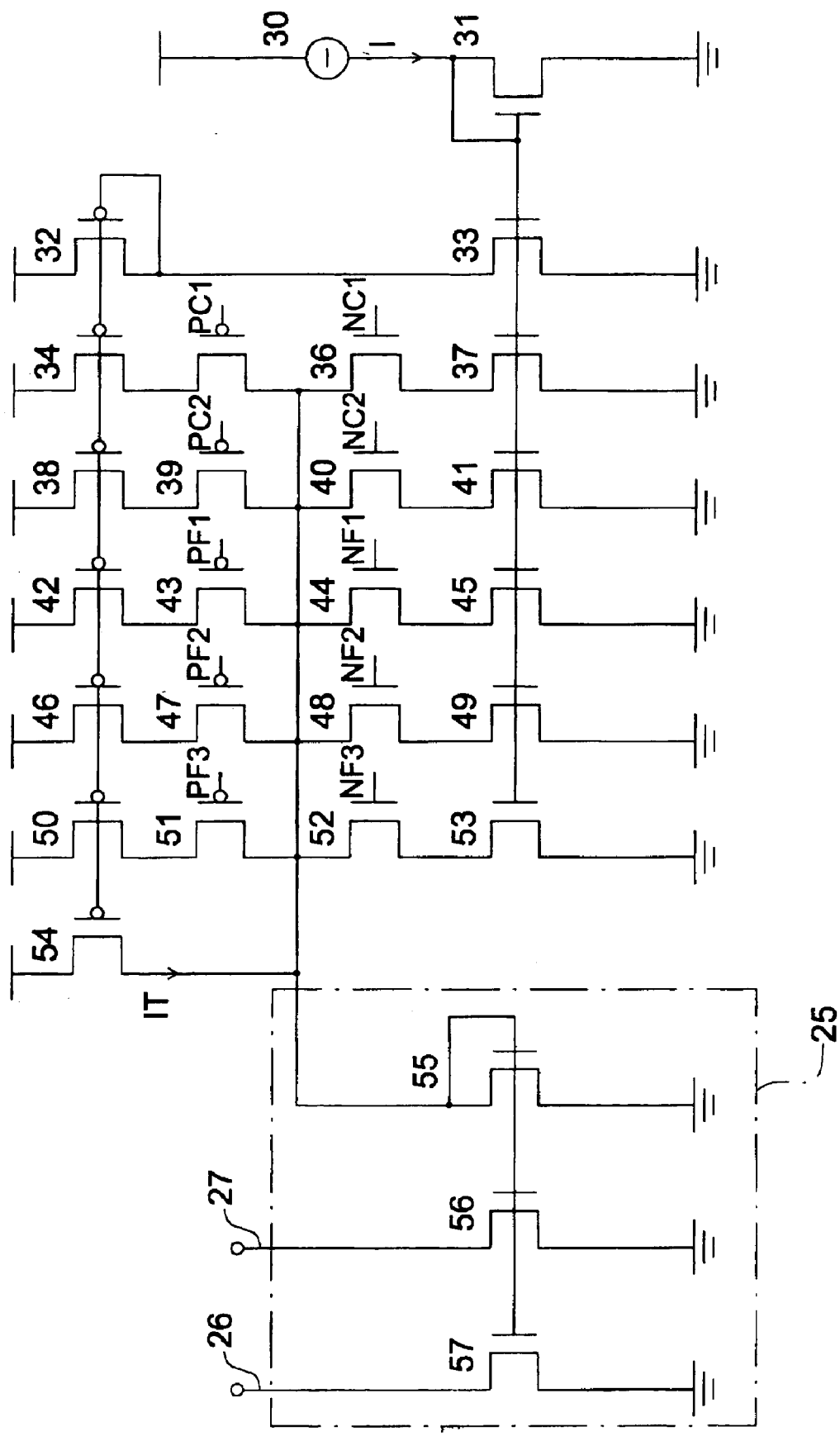
FIG. 3 is a partial schematic of the control logic and of the current generator of FIG. 1.

The signals S1–S10 represent the signals that, in a first phase, define which of the available currents is activated and, in a second phase, once the determination procedure of the correct current is over, define the currents believed valid during the procedure and activating the respective current generators, represented in FIG. 3.

The outputs of the AND gates A1–A10 are respectively PC1, PC2, NC1, NC2, PF1, PF2, PF3, NF1, NF2, NF3. The flip flop FF1–FF10 and the outputs of the AND gates A1–A10 are separated in the first four that represent four coarse current values (two positive and two negative) and in the following six that represent six values of thin currents (three positive and three negative).

Figure 2B:
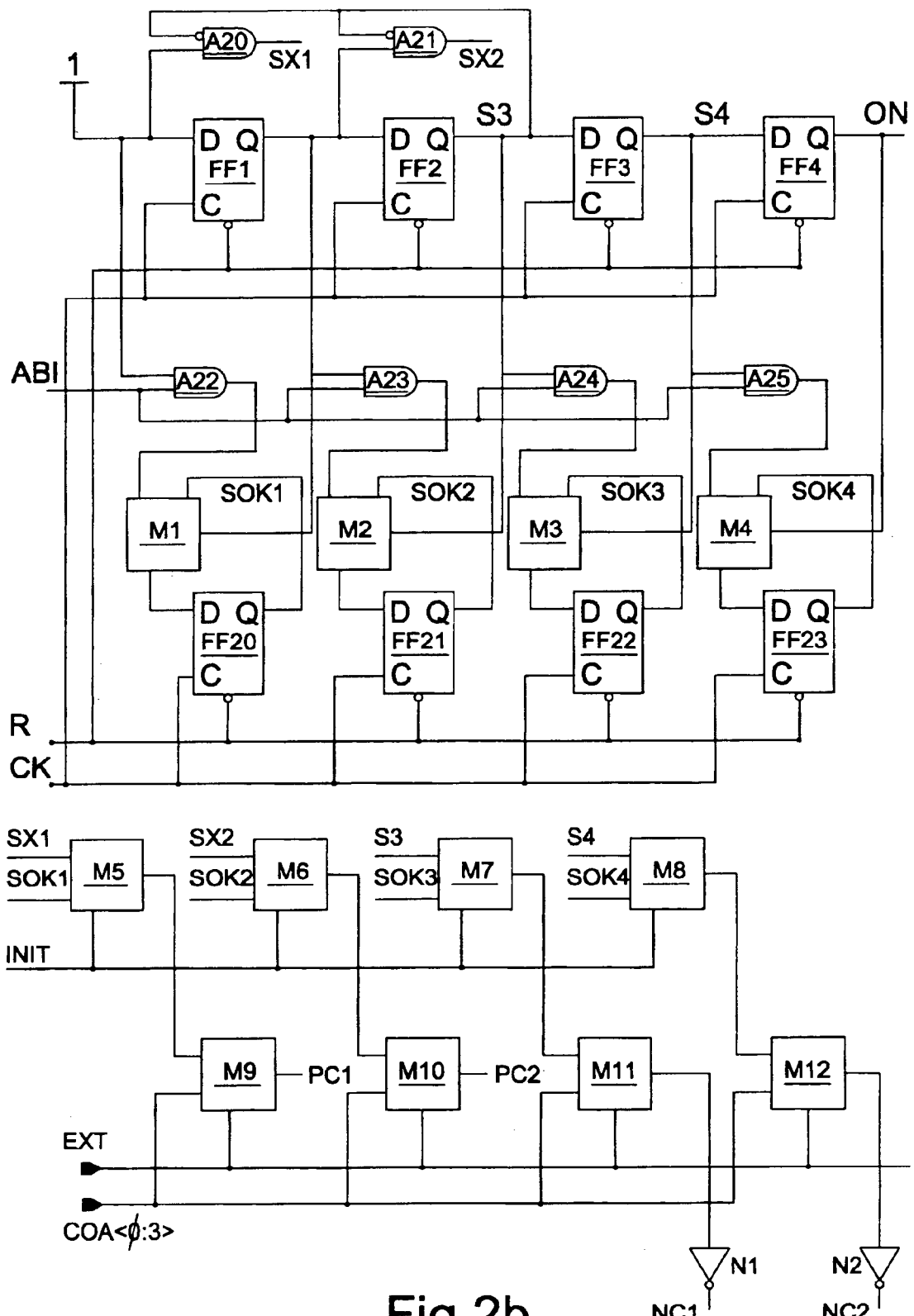
FIG. 2b shows a more detailed partial schematic in comparison to the FIG. 2a, of the control logic of FIG. 1;.

In FIG. 2b is shown a partial scheme of the control logic 21 of FIG. 1, which is more detailed with respect to FIG. 2a. Only the circuit portion related to the management of the four coarse current values is shown therein and the four flip flops FF1–FF4 are shown. The AND gates A22–A25, the multiplexers M1–M4, and the flip flops FF20–FF23 constitute the memory of the valid currents, while the signal ABI is active high when the oscillation frequency is correct (in the specific case such a signal is high if the quartz is oscillating in the third harmonic).

The multiplexers M5–M12 provide the signals PC1, NC1, PC2, and NC2 on the basis of the signals coming from the memory of the valid currents.

The signal INIT, which goes high after the coarse trimming phase, allows to bias the oscillator with the stored currents.

The signal EXT is a signal at the service of the DSP or the smart machine that manages the oscillator to bias the same with the currents COA<0:3> via software.

The output signal OUT will provide the signal to a circuit similar to that of FIG. 2b comprising the flip flops FF5–FF10 and related to the management of the six lower current values.

In FIG. 3 a current generator 30 supplies a current I to a terminal of a transistor 31 of the N type connected as a diode toward ground. The current I is mirrored in the transistors 33, 37, 41, 45, 49 and 53 of the N type. The transistor 33 is connected to a transistor 32 of the P type connected as a diode toward the positive power supply that mirrors the current in the transistors 34, 38, 42, 46, 50 and 54 of the P type.

A first branch is composed, starting from the positive power supply, by the transistor 34, by the transistor 35 of the P type, by the transistor 36 of the N type, and by the transistor 37.

Other four branches similar to the first branch mentioned above, composed by the following transistors, are present: A second branch of transistors 38, 39, 40 and 41; a third branch of transistors 42, 43, 44 and 45; a fourth branch of transistors 46, 47, 48 and 49; and a fifth branch of transistors 50, 51, 52 and 53.

The transistors 35, 36, 39, 40, 43, 44, 47, 48, 51, and 52 respectively receive on their gates the signals PC1, NC1, PC2, NC2, PF1, NF1, PF2, NF2, PF3, NF3.

The intermediary points of the 5 branches are connected with each other, and the current collected in this node is supplied to a transistor 55 of the N type connected as a diode toward ground. To this transistor a current IT produced by the transistor 54 is also supplied. It represents the nominal bias current.

The current of the transistor 55 is mirrored in the transistors 56 and 57 of the N type, whose drain current respectively corresponds to the signals 27 and 26. The transistors 55, 56 and 57 schematically represent the current generator 25.

The current generator 25 provides the bias currents of the amplifier 14 and of the filter 13, by means of the signals 26 and 27 respectively. The current will be proportional to the dimensions of the transistors 56 and 57 and to the current provided by the transistor 55. To the transistor 55 is provided a current that will be the algebraic sum of the current IT provided by the transistor 54 and by the currents coming from the 5 branches mentioned above.

Based on the values of the signals coming from the AND gates A1–A10, the transistors of the branches mentioned above will be opened or closed and they will provide a current to the transistor 55.

Every branch has the possibility of providing a positive current if the high transistor is closed (35, 39, 43, 47, 51), a negative current if the low transistor is closed (36, 40, 44, 48, 52), or both currents if both are closed, that is a null current.

The first two branches (that receive the signals PC1, NC1, PC2, NC2 and represent the four values of higher currents) are determined so as to provide a current for example equal to 25% of the current IT (both in the positive and in the negative).

The other three branches (that receive the signals PF1, NF1, PF2, NF2, PF3, NF3 and represent the six values of lower currents) are dimensioned so as to provide a current for example equal to the 8% of the current IT (both in the positive and in the negative).

Based on the signals coming from the AND gates A1–A4 it is therefore possible, in the above example, to have currents equal to IT, IT±25%, and IT±50%.

After the evaluation phase of the greater currents, the algebraic sum of those currents that have allowed the oscillator to produce a sinusoid signal at the correct frequency is executed.

With the new current value (algebraic sum of the functional higher currents) the fine trimming phase with the following possibilities is started:
IT, IT±8%, IT±16%, IT±24%
IT±25%, IT±33%, IT±41%, IT±49%, IT±17%, IT±9%, IT±1%
IT±50%, IT±58%, IT±66%, IT±74%, IT±42%, IT±34%, IT±26%

At the activation of the control logic 21 by means of the activation circuit 23, the current IT is supplied to the current generator 25, a further current is supplied and the presence of the oscillation is verified by means of the oscillation detector 20. In the affirmative case the oscillation frequency correctness is verified by means of the ramp generator 17 and the comparator 18. In the affirmative case there is stored in a special memory of the valid currents an indication that the provided current is valid.

In the negative case, in both the cases, it is necessary to proceed with proposing a different current subsequently activating the various available currents by means of the signals S1–S10. When all the possible available currents have been proposed, and the verifications are effected (presence of the oscillation signal and oscillation frequency correctness) for every current proposal, storing the information indicative that such a current value has met the verifications, the information related to what currents are believed valid will be stored in the memory of the valid currents. Accordingly all the currents believed valid will be activated by means of the signals S1–S10, and at the transistor 55 the algebraic average of such currents will be present.

Such a procedure can be performed whenever it is required.

In other words, the current IT (typical current that has been considered the correct bias in the design phase) will always be provided to the transistor 55. Then the current related to the first flip flop FF1 is proposed, that is the signal PC1 is activated, and the two above verifications are effected. In the affirmative case for both the verifications, the information that the current related to the signal PC1 is a valid current will be stored. In the negative case nothing is stored. The current related to the second flip flop FF2 is proposed at this point, that is the signal PC2 is activated, the two verifications are effected, and in the affirmative case the information that the current related to the signal PC2 is a valid current is stored in memory.

After all the proposable greater currents have been proposed to the transistor 55, the current IT plus the algebraic average of the currents believed valid are provided. The current previously found valid is provided and moreover the fine currents are proposed according to the same procedure described above. At the end of the whole procedure the total current equal to IT plus the algebraic sum of the currents believed valid will be provided.

In an alternative embodiment, it is eventually possible not to provide the current IT and to determine the correct current completely by means of the above mentioned procedure.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for the determination of a bias current of a quartz oscillator, comprising the phases of: defining a series of bias currents having a prefixed value; supplying a bias current value not yet used to said quartz oscillator; verifying the oscillation frequency at the output of said quartz oscillator; supplying in the negative case a bias current value not yet used to said quartz oscillator and; verifying a correct oscillation frequency; supplying in the negative case a bias current not yet used to said quartz oscillator and verifying the oscillation frequency at the output of said quartz oscillator; storing in the positive case an indication that the supplied current is valid; repeating the preceding phases up to the exhaustion of said series of values of bias currents; fixing as a bias current of said quartz oscillator the algebraic average of the currents regarded as valid.

2. The method of claim 1 wherein said series of values of bias currents is divided in two sections; the first section has current values separated from each other by a first preset value, the second section has current values separated from each other by a second preset value, said second preset value is lower than said first preset value.

3. The method of claim 1 wherein said phases are performed at the turning on of said quartz oscillator.

4. The method of claim 1 wherein said phases are performed occasionally.

5. The method of claim 1 wherein said phases are performed periodically.

6. The method of claim 1 wherein the algebraic average of the currents regarded as valid plus a preset current is fixed as the bias current of the quartz oscillator.

7. A method for determining a bias current of a quartz oscillator, comprising:

defining a plurality of bias current values;

supplying in sequence the plurality of bias current values to the quartz oscillator;

determining the oscillation frequency of an output signal at the output of the quartz oscillator corresponding to each bias current value;

determining the bias current values having a valid oscillation frequency in the output signal of the quartz oscillator; and fixing as a bias current of the quartz oscillator an algebraic average of the bias currents determined to have a valid oscillation frequency in the signal output of the quartz oscillator.

8. The method of claim 7 wherein determining the bias current values having valid oscillation frequencies further comprises storing in a memory a reference to the bias current values having valid oscillation frequencies in the output signal of the quartz oscillator.

9. The method of claim 1 wherein defining the plurality of bias current values comprises defining a series of positive bias current values and a series of negative bias current values.

10. The method of claim 9 wherein the plurality of bias current values is divided into two sections, a first section having bias current values separated from each other by a first preset value, and a second section of bias current values separated from each other by a second preset value, and the second preset value is set to be lower than the first preset value.

11. The method of claim 1 wherein fixing as a bias current of the quartz oscillator further comprises adding the algebraic average of the bias current values determined as having valid oscillation frequencies of the output signal of the quartz oscillator to a preset current value.

12. The method of claim 7 wherein the method is performed each time the quartz oscillator is turned on.

13. The method of claim 7 wherein the method is performed periodically.

14. An apparatus for determining a bias current of a quartz oscillator for generating an output signal, the apparatus comprising:

a ramp signal generator having an input coupled to an output of the quartz oscillator and an output on which is generated a ramp signal in response to the quartz oscillator output signal;

a voltage comparator comparing the ramp signal to a reference voltage and generating a comparison output signal;

a control logic circuit having an input for receiving the comparison output signal from the comparator, the control logic circuit configured to generate a bias current control signal at an output thereof responsive to the comparison output signal of the comparator; and a current generator having an input for receiving the bias current control signal from the control logic circuit and for generating a bias current signal to the quartz oscillator;

wherein the control logic circuit is further configured to determine the bias current of the quartz oscillator by:

generating a plurality of bias currents having a prefixed value;

supplying the plurality of bias current values to the quartz oscillator;

verifying the oscillation frequency of an output signal generated by the quartz oscillator for each of the plurality of bias current values;

storing the bias current values determined to have valid oscillation frequencies in the output signal of the quartz oscillator; and determining as a bias current of the quartz oscillator the algebraic average of the bias current determined to have valid oscillation frequencies at the output signal of the quartz oscillator.

15. The apparatus of claim 14 wherein the control logic circuit is further configured to generate the plurality of bias current values in two sections, a first section having bias current values separated from each other by a first preset value, and a second section having bias current values separated from each other by a second preset value, the second preset value being lower than the first preset value.

16. The apparatus of claim 15, further comprising an activation circuit having an output coupled to an activation input of the control logic circuit for initiating the determination of the bias current of the quartz oscillator.

17. The apparatus of claim 16, further comprising an oscillation detector circuit having an input coupled to the output of the quartz oscillator and an output coupled to an oscillation detector output signal input of the control logic circuit.

18. The apparatus of claim 17, further comprising a clipper amplifier circuit coupled between the quartz oscillator and the ramp generator circuit and further between the quartz oscillator and the oscillation detector circuit.

* * * * *